(12) United States Patent
Yuan et al.

(10) Patent No.: US 7,172,927 B2
(45) Date of Patent: Feb. 6, 2007

(54) WARPAGE CONTROL OF ARRAY PACKAGING

(75) Inventors: Yuan Yuan, Austin, TX (US); Sheila F. Chopin, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 133 days.

(21) Appl. No.: 10/740,303

(22) Filed: Dec. 18, 2003

(65) Prior Publication Data

US 2005/0136567 A1    Jun. 23, 2005

(51) Int. Cl.
*H01L 21/44* (2006.01)
*H01L 21/48* (2006.01)
*H01L 21/50* (2006.01)

(52) U.S. Cl. ............................ 438/127; 257/E21.502
(58) Field of Classification Search ................ 438/127
See application file for complete search history.

(56) References Cited

U.S. PATENT DOCUMENTS

| 5,492,866 | A | * | 2/1996 | Nishikawa | ................... | 29/827 |
|---|---|---|---|---|---|---|
| 5,528,457 | A | * | 6/1996 | Hawke et al. | .............. | 361/706 |
| 5,868,887 | A | * | 2/1999 | Sylvester et al. | ........... | 156/150 |
| 6,013,541 | A | * | 1/2000 | Tan et al. | ................... | 438/106 |
| 6,027,590 | A | * | 2/2000 | Sylvester et al. | ........... | 156/150 |
| 6,164,946 | A | * | 12/2000 | Mess | ........................ | 425/125 |
| 6,224,936 | B1 | * | 5/2001 | Gochnour et al. | ......... | 427/96.2 |
| 6,527,999 | B2 | * | 3/2003 | Gochnour et al. | .......... | 264/266 |
| 6,592,670 | B1 | * | 7/2003 | Gochnour et al. | .......... | 118/500 |
| 6,764,549 | B2 | * | 7/2004 | Gochnour et al. | .......... | 118/500 |
| 6,830,719 | B2 | * | 12/2004 | Gochnour et al. | .......... | 264/231 |
| 6,969,641 | B2 | * | 11/2005 | Matsunami | ................. | 438/127 |

* cited by examiner

*Primary Examiner*—David A. Zarneke
(74) *Attorney, Agent, or Firm*—Joanna G. Chiu; Michael P. Noonan

(57) ABSTRACT

During the curing process of the package strips, especially during post encapsulant cure (PEC), undesirable warpage of package strips occurs. A carrier having angled lands and side-insertion clamp structures with angled clamp fins may be used to control this cure-induced warpage of package strips during PEC. In one embodiment, the angled lands and angled side-insertions clamps are used to clamp the edges of the package strip in order to introduce an intentional deformation which counters warpage which occurs during PEC. The angled lands and side-insertion clamps may be at any angle (fixed or adjustable). The side-insertion clamps may be inserted before or after insertion of the package strips into the carrier. Once the package strips are in the carrier and resting on the angled lands, a force may be applied to the side-insertion clamps to clamp the edges of the package strips between a clamp fin and an angled land.

13 Claims, 4 Drawing Sheets

WARPAGE CONTROL OF ARRAY PACKAGING

FIELD OF THE INVENTION

The present invention relates generally to semiconductor packaging, and more specifically, to warpage control of array packaging.

RELATED ART

Single array and multi-array packaging techniques are currently used today to reduce processing time and cost. FIG. 1 illustrates a package strip 10 as known in the art. Package strip 10, as illustrated in FIG. 1, is a multi-array package (MAP) having a plurality of devices like devices 16, 17, and 18 in the form of an array overlying a package substrate 12. Alternatively, package strip 10 may be a single array package. Package substrate 12 may be a laminate package substrate, formed as known in the art, and may include any number of laminate layers. Each device 16–18 includes an integrated circuit die physically and electrically connected to package substrate 12. For example, the integrated circuit die may be physically attached to the package substrate using an adhesive, and may be electrically coupled to the package substrate via wire bonds, as known in the art today. After attaching and electrically connecting the integrated circuit die to the package substrate, an encapsulant 14 may be formed over the integrated circuit dies while leaving a perimeter portion at the edges of package substrate 12. Encapsulant 14 may be any type of encapsulant, such as, for example, a thermal set overmold or a glob. Furthermore, encapsulant 14 may encapsulate all devices of strip 10 together, as illustrated in FIG. 1, or may encapsulate groups of devices or single devices of strip 10. For example, smaller arrays of devices within strip 10 may be encapsulated together such that encapsulant 14 includes separate encapsulant portions.

FIG. 2 illustrates a cross-sectional view of packaged substrate 12 taken through devices 16, 17, and 18. As illustrated in FIG. 2, each device 16–18 includes an integrated circuit die 20–22, respectively, attached to package substrate 12 between two corresponding singulation marks 28. Each of the integrated circuit dies 20–22 are electrically connected to package substrate 12 via wire bonds 24–26, respectively. Therefore, at some point later in the process, each of devices 16–18 may be singulated along the singulation marks 28. That is, referring back to FIG. 1, each of the devices may singulated from each other by separating the devices between the dotted lines illustrating the perimeters of the devices. In one embodiment, singulation is done by punching, cutting, or sawing.

During formation of encapsulant 14, curing is performed to cross-link or harden the encapsulant material. After formation of encapsulant 14, strip 10 may be placed in a carrier for a post encapsulant cure (PEC) in order to allow the curing process to continue. (Note that when encapsulant 14 is a thermally set overmold, post encapsulant cure may be referred to as post mold cure (PMC)). That is, during the PEC, the encapsulant material continues to cross-link or harden to solidify the final curing stage of the encapsulant material. FIG. 3 illustrates a conventional carrier 30, used today in the art, having slots such as slots 32 and 36 into which package strips 31 and 33 (each of which may be a package strip such as package strip 10) may be placed. Therefore, the curing of package strips 31 and 33 continues within carrier 30. The package strips slide into slots 32 and 36 and rest atop horizontal lands 34 and 38, respectively.

Generally, note that the PEC (while in the carrier) is substantially longer than the curing process performing during the formation of the encapsulant. During the curing process, especially during the PEC in carrier 30, warpage of the package strips occurs. For example, as illustrated in FIG. 3 with package strip 33, warping of the package strips occurs which causes problems in later processing. This warpage may be caused, for example, by the mismatch of coefficients of thermal expansions (CTEs) of the various components of the package strip such as the package substrate, encapsulant, and integrated circuit dies. The amount of warpage is also affected by the size, thickness, and materials of the encapsulant, package substrate, and integrated circuit die. This warpage causes problems later in manufacturing, and therefore needs to be minimized.

One attempt at solving this problem today uses a piling technique where after encapsulation, the package strips are piled on top of each other with a weight or other pressure applied to the top of the pile. However, this does not adequately control warpage during the PEC after piling. Furthermore, the use of piling increases manufacturing time thus reducing line efficiency.

Another attempt at solving this problem today modifies carrier 30 to have tighter slots. For example, the openings of the slots (such as slots 32 and 36) are reduced; however, sufficient empty space still exists within the slot opening between the top of a package strip and the next horizontal land above it to allow the strips to slide in an out. That is, the package strip is not in physical contact with the top of the next horizontal land before PEC. However, this does not effectively reduce warpage. Furthermore, any warpage which does occur may prevent the strip from being able to be removed from the carrier due to the warped strip being stuck in the tight slots.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
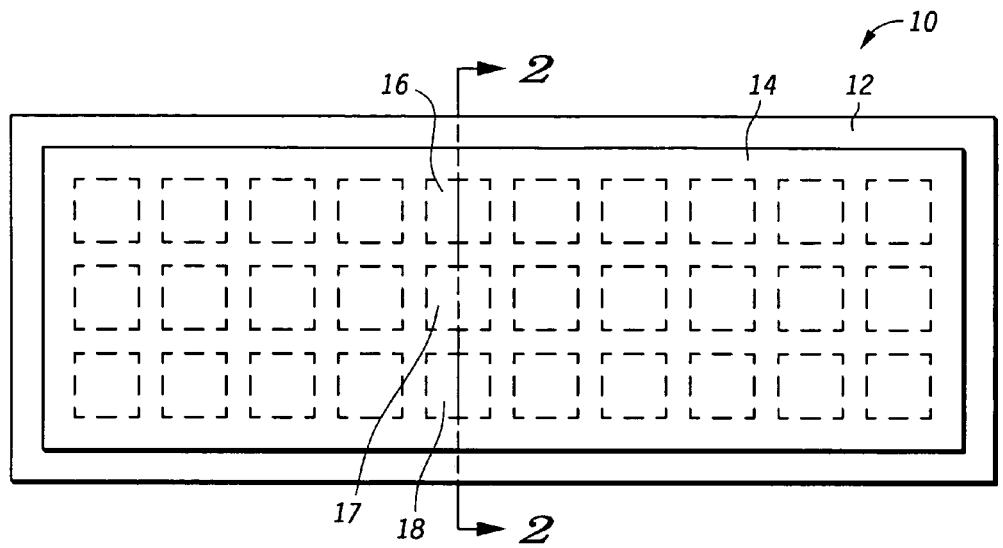
FIG. 1 illustrates a top-down view of a package strip as known in the art.
Figure 2:
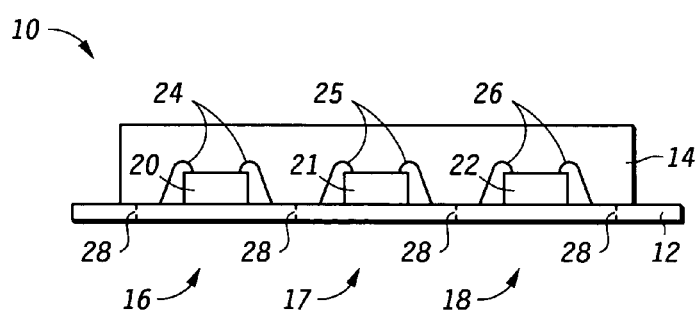
FIG. 2 illustrates a cross-sectional view of the package strip of FIG. 1.
Figure 3:
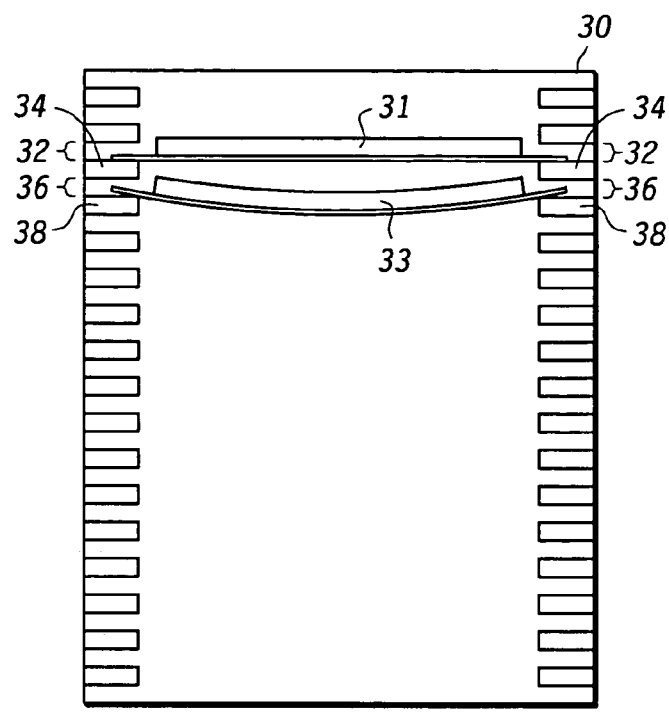
FIG. 3 illustrates an end view of a package strip carrier as known in the art today.

As described above, the curing process, especially during PEC, causes undesirable warpage of package strips, such as package strip 10 of FIG. 1. As will be described herein, a carrier having angled lands and side-insertion clamp structures may be used to control cure-induced warpage of package strips during PEC. Therefore, the embodiments described herein apply to package strip 10 of FIG. 1. As described above, package strip 10 is illustrated as a MAP, but alternatively it may be a single array package having only one row of devices. Therefore, the embodiments described herein apply to any type of package strip such as any type of MAP or single array package; however, for ease of explanation, the embodiments described herein will be described in reference to package strip 10 of FIG. 1.

Figure 4:
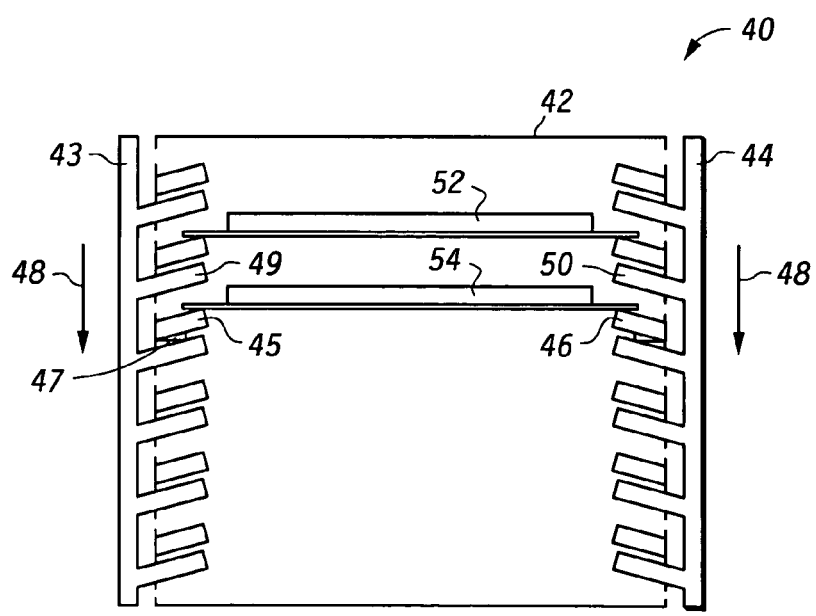
FIG. 4 illustrates an end view of a carrier assembly having side-insertion clamp structures according to one embodiment of the present invention.

FIG. 4 illustrates a carrier assembly 40 including a carrier 42 and side-insertion clamp structures 43 and 44, according to one embodiment of the present invention. Note that carrier 42 includes a plurality of angled lands such as angled lands 45 and 46 along each inner or interior sidewall. These angled lands are illustrated as lined up along a dotted line because there are spaces between the angled lands (see, e.g., spaces 68 of FIG. 6). The angled lands are held together with support bars (see, e.g., support bars 66 of FIG. 6) extending down the length of carrier 42. For example, these bars may exist at the openings of either end of carrier 42 and at predetermined spaces along the sides of carrier 42. Carrier 42, as illustrated in FIG. 4, is holding two package strips, package strips 52 and 54, resting on corresponding angled lands. For example, package strip 54 is resting on angled lands 45 and 46. Note that at this point, each of package arrays 52 and 54 have had encapsulants formed thereon and are substantially horizontal (in reference to the tops and bottoms of carrier 42) when placed in carrier 42. Note that carrier 42 may be of any size and may include any number of angled lands to support any number of package strips. Therefore, although only two package strips are illustrated, carrier 42 may include any number of package strips for which there are angled lands available.

As illustrated in FIG. 4, each of the angled lands, such as angled land 45, is as at an angle 47 as measured from a horizontal axis, where the horizontal axis of FIG. 4 is substantially parallel to package strips 52 and 54 and the tops and bottom of carrier 42. Angle 47 may be any angle, including 0 degrees. In one embodiment, angle 47 is fixed such that each of the angled lands of carrier 42 are fixed at a same angle. Alternatively, the angled lands of carrier 42 may be designed such that angle 47 can be adjusted as desired. For example, the angled lands may be attached with rotating hinges to the sidewalls of carrier 42. In one embodiment, angle 47 is at a non-right angle to the sidewall of carrier 42. Also, in one embodiment, angle 47 is at a non-right angle to the package strips 52 and 54. Note that in one embodiment, all of the angled lands are at a same angle with respect to the sidewalls of carrier 42.

Also illustrated in FIG. 4 are side-insertion clamp structures 43 and 44, where each of the clamp structures includes clamping fins (or clamp fins) such as clamping fins 49 and 50, respectively (supported by clamp bars, as will be described in reference to FIG. 7 below). The clamping fins, such as clamping fins 49 and 50, are inserted into the spaces between the angled lands of carrier 42. They are inserted such that each clamping fin is close to the angled land above the clamping fin, thus leaving sufficient space for package strips 52 and 54 resting upon the angled lands. Therefore, there are generally as many clamping fins as there are angled lands. Also, the clamping fins are at substantially a same angle with respect to the horizontal axis as the angled lands (where this angle may be fixed or adjustable). That is, the clamping fins and angled lands are substantially parallel. Note that in one embodiment, clamp structures 43 and 44 may be present as illustrated in FIG. 4 prior to insertion of package strips such as package strips 52 and 54 into carrier 42, or may be inserted after insertion of the package strips.

Figure 5:
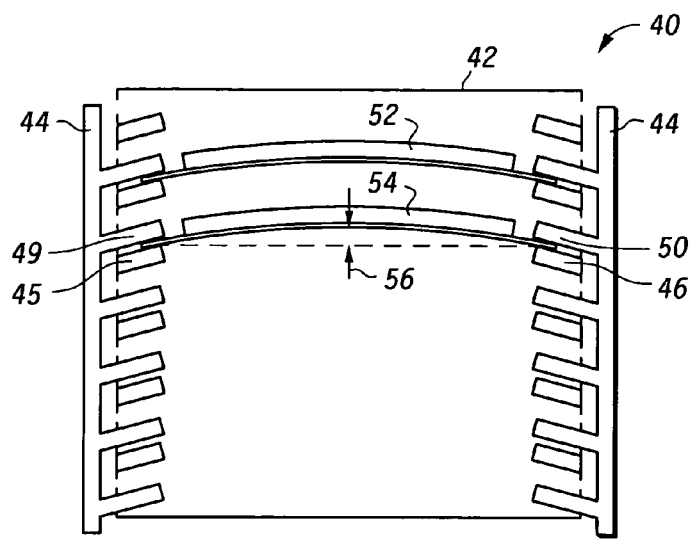
FIG. 5 illustrates the carrier assembly of FIG. 4 after application of a clamping force.

After the clamp structures and package strips are in place, as illustrated in FIG. 4, clamp structures 43 and 44 are used to clamp the edges of package strips 52 and 54. In one embodiment, a clamping force illustrated with arrow 48 is applied to allow clamp structures 43 and 44 to clamp the edges. FIG. 5 illustrates carrier assembly 40 and package strips 52 and 54 after clamping the edges of package strips 52 and 54 where the clamping force constrains package strips 52 and 54 between a corresponding angled land and clamping fin. Therefore, in one embodiment, upon application of the clamping force, a major surface portion of the package substrates (of package strips 52 and 54) near an edge of the package substrates (e.g. a first major surface periphery of the package substrates) is engaged with clamping fins disposed at an angle to the major surface.

Due to the angled lands and the angled clamping fins, the clamping of package substrates 52 and 54 results in an initial deformation of package strips 52 and 54. For example, package strips 54 deviates from the horizontal axis by a warp distance 56. In one embodiment, package strips 52 and 54 are deformed to have a resulting curvature that is different from an at-rest curvature, where the at-rest curvature is a curvature that is present without application of stresses or force to package strips 52 and 54 but which may already include some degree of warpage due, for example, to prior processing steps. In one embodiment, the at-rest curvature corresponds to the curvature that is present prior to deformation (introduced, for example, by clamp structures 43 and 44). In one embodiment, package strips 52 and 54 are deformed to have a constrained curvature (upon clamping) that is different from an at-rest curvature. The intentional deformation of package strips 52 and 54 may therefore be used to counter the expected cure-induced warpage due to subsequent PEC. That is, the clamping by clamp structures 43 and 44 is held during the PEC in order to counter the warpage. Therefore, during PEC, package substrates 52 and 54 warp, but this warpage is countered by the initial deformation held by clamp structures 43 and 44. After PEC, clamp structures 43 and 44 may be released, such that the package structures may be removed from carrier 42. In one embodiment, package strips 52 and 54 are held in carrier 42 during PEC and are maintained in carrier 42 for a time after PEC before being removed.

Note that in one embodiment, the initial deformation (which may be introduced by clamping) causes an arc in a first reference direction to provide stiffness to the package strips to prevent warpage (during, for example, PEC) in the first direction and in a second reference direction substantially orthogonal to the first reference direction. Alternatively, different types and forms of initial deformation may be performed to counter warpage. Also note that in alternate embodiments, clamping without an initial deformation may also be used to counter warpage. In this embodiment, the clamping may or may not cause package strips 52 and 54 to deform away from their at-rest curvature. For example, clamp structures 43 and 44 may be used to constrain the edges of package strips 52 and 54 at an angle that is substantially orthogonal to the sidewalls of carrier 42 (thus introducing substantially no initial intentional deformation)

where the clamping itself counters warpage during PEC. Therefore, in this embodiment, package strips 52 and 54 may have a constrained curvature upon clamping that is not substantially different from an at-rest curvature. Also, as described above, the encapsulant of package strips 52 and 54 may be partially cured prior to clamping, where this partial curing may occur during formation of the encapsulant or in carrier 42 or both.

The angled lands and clamp fins can be formed at any angle needed such that an appropriate amount of deformation is introduced on package strips 52 and 54 to counter cure-induced warpage. For example, the angles of the angled lands and clamp fins can be set to counter an expected cure-induced warpage, where the amount of expected warpage is known. This cure-induced warpage depends, for example, on various factors such as the thickness of the dies, the sizes of the dies, the type of package, etc. In one embodiment, the angles of the angled lands and clamp fins can be set based on these types of factors. Furthermore, they can be modified as needed based on any changes in these types of factors. In an alternate embodiment, an amount of the PEC warpage of the package strips may be measured as guide for applying any clamping force, and the angle of the lands and clamp fins may be selected based on this measured warpage. In yet another embodiment, as described above, the angle may be set such that substantially no amount of deformation is introduced by the clamping.

Figure 6:
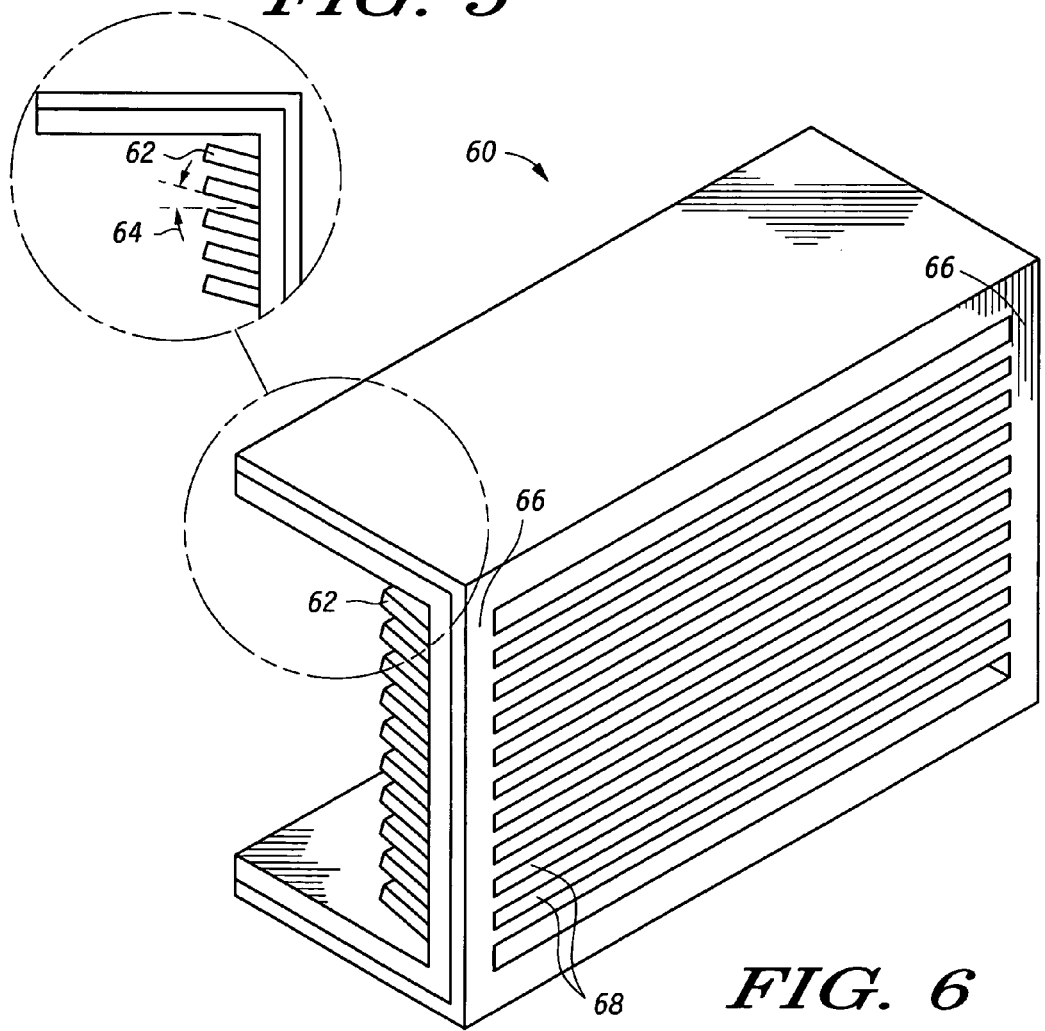
FIG. 6 illustrates a three-dimensional view of a portion of the carrier assembly of FIGS. 4 and 5.
Figure 7:
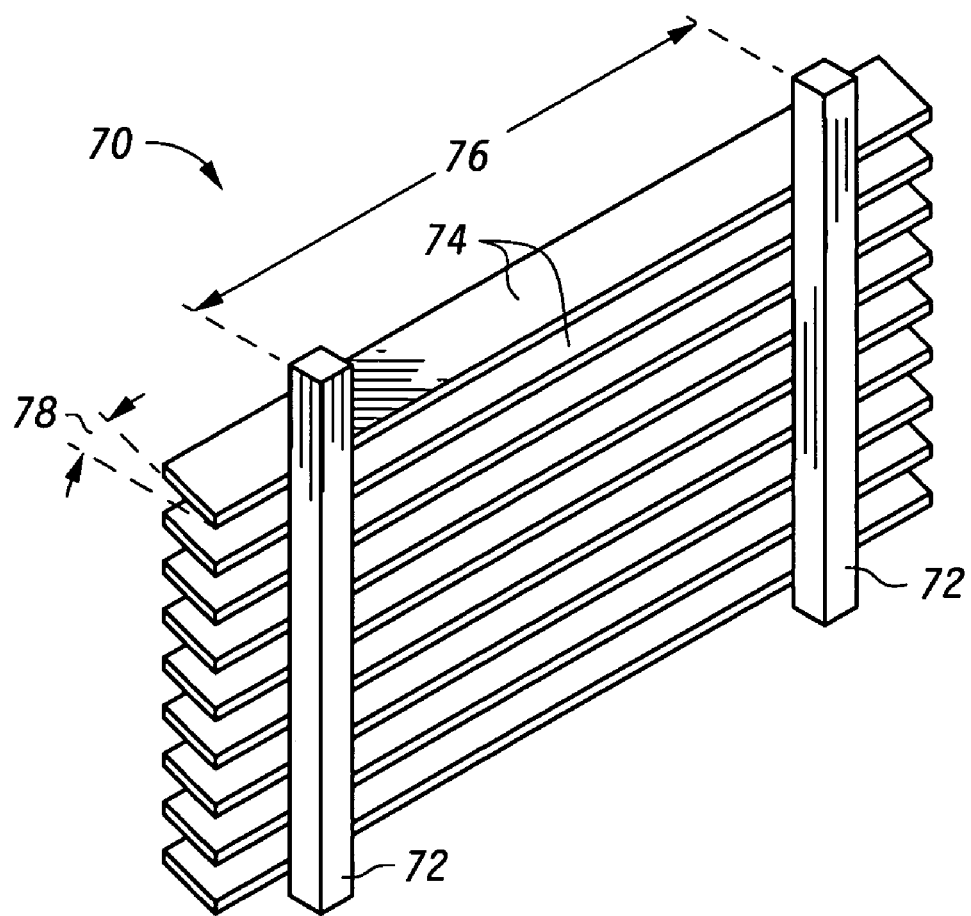
FIG. 7 illustrates a three-dimensional view of a side-insertion clamp structure such as those illustrated in FIGS. 4 and 5.

FIGS. 6 and 7 illustrate three-dimensional views of a carrier and a clamp structure, respectively. FIG. 6 illustrates a portion of a carrier 60 (which may correspond, for example, to carrier 42) having angled lands 62 which are at an angle 64 with a horizontal plane, where the horizontal plane of FIG. 6 is defined as perpendicular to the plane define by the illustrated sidewall of carrier 60. Note that as described above, carrier 60 includes support bars 66 (where, in the illustrated embodiment, support bars 66 also form part of the out edge of carrier 60). Note that in alternate embodiments, more or less support bars than those illustrated may be used. For example, a support bar may be used between support bars 66 of FIG. 6. Note that as described above, spaces such as spaces 68, exist between the angled lands which allow for insertion of a clamp structure. FIG. 7 illustrates a portion of a clamp structure 70 (which may correspond, for example, to either one of clamp structures 43 and 44). Clamp structure 70 includes support or clamp bars 72 (as also illustrated in FIGS. 4 and 5) which are used to support clamp fins 74 at an angle 78, where angle 78 is measured from a horizontal plane (which is perpendicular to the plane defined by support bars 72 where, for example, this horizontal plane is parallel to a horizontal plane defined by dotted lines 76). Clamp bars 72 may be located on sides of clamp fins as illustrated in FIG. 7, or located at the ends of the fins. Clamp fins 74 may be inserted into spaces of a carrier (such as spaces 68 of carrier 60). Note that carrier 60 and clamp structure 70 may have many different forms which allow for clamping of package strips. Furthermore, the angles such as angles 78 and 64, may be fixed or variable.

Note that the angles of the angled lands and clamp fins described in reference to FIGS. 4 and 5 are illustrated as non-zero with respect to the horizontal axis of FIG. 4. However, in one embodiment, the angle is zero such that the angled lands and clamp fins are perpendicular to the sidewalls of carrier 42. In this embodiment, clamp structures are used to clamp the package strips to help counter warping during PEC. In this embodiment, note that the clamping does not result in an initial deformation as illustrated in FIG. 5. However, note that in many embodiments, regardless of what the angle is of the angled lands and clamp fins, after clamping, the edges of the package strips are clamped between an angled land and clamp fin and thus in physical contact with both the angled land and clamp fin which reduces the array warpage.

Note also that in FIGS. 6 and 7, the angled lands (such as angled land 62 in FIG. 6) and clamp fins (such as clamp fin 74 in FIG. 7) are illustrated as straight in the longitudinal direction. For example, note that in FIG. 6, the edge of each angled land 62 that is adjacent to a wall of carrier 60 (e.g. attached to support bars 66) is at a constant distance from the bottom (or top) of carrier 60, and that in FIG. 7, the edge of each clamp fin 74 that is adjacent to support bars 72 is at a constant distance from the bottom (or top) of support bars 72. However, in alternate embodiments, these angled lands and clamp fins can be made curved or arched with a curvature counter to the warpage induced in the PEC. For example, a center portion (e.g. between dotted lines 76) of angled lands 62 and clamp fins 74 may be at a greater distance from the bottom of carrier 60 and support bars 72, respectively, as compared to end portions (located at the front and back openings or portions) of carrier 60 and clamp structure 70. Alternatively, angled lands 62 and clamp fins 74 may have any other type of curvature, as desired, to counter or control warpage. Therefore, in one embodiment, angled lands 62 and clamp fins 74 may be both angled and curved.

Note that the clamping of FIGS. 4 and 5 was described in reference to a force indicated by 48 which is applied in a direction indicated by arrow 48. This clamping force can be applied in a variety of different ways using a variety of different implementations. For example, in one embodiment, the clamping structures may be pulled down in the direction of arrows 48 and fixed to a fixed point, using, for example, a screw, peg, or other securing mechanisms. Alternatively, the clamping structures may be pushed down in the direction of arrows 48 and secured to a fixed point, using, for example, a screw, peg, or other securing mechanisms. Therefore, any means of applying a force may be used and any means of maintaining that force to allow the clamp structure to remain clamped may be used. For example, the clamping may be performed by applying a weight or force, by rotating a screw, by setting or releasing a spring, by an actuating level, etc., or by any combination thereof.

Alternate embodiments may use various other ways of achieving the clamping and of achieving an intentional deformation. For example, the edges may be clamped prior to applying a force for inducing an initial deformation. In this example, the lands and clamp fins may initially be orthogonal (or at some other angle) to the sidewalls of the carrier, where after clamping, the lands and fins may be angled or otherwise affected in order to apply a deformation force to the package strips that results in the initial deformation (if that initial deformation is desired). That is, in alternate embodiments, a clamping force may be used such that no initial deformation is introduced. In this case, the clamping force constrains the package strips during PEC to counter warpage without an initial deformation. Alternatively, intentional deformation can be achieved by placing package strips into slots of a carrier, and then squeezing the sides of the carrier to reduce the width such that an intentional deformation is introduced. Forces other than squeezing may also be used to create and maintain the counter warpage. Also, different forms of clamping fins and clamping structures may be used to clamp the package strips, regardless of whether a deformation is introduced or not.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for controlling warpage of a package strip during curing, the package strip including a plurality of integrated circuit dies encapsulated on a package substrate, the method comprising:
   clamping edges of the package substrate to hold the package substrate in a position to decrease cure-induced warpage of the package substrate during curing of the encapsulant, wherein clamping comprises engaging a major surface portion of the package substrate near an edge of the package substrate with non-zero angled fins disposed at a non-zero angle to the major surface to apply a force to the package substrate to cause an initial deformation to the package substrate to counter an expected cure-induced warpage of the encapsulant on the package substrate;
   curing the encapsulant;
   releasing the edges of the cured package substrate; and
   partially curing the encapsulant before clamping the edges of the package substrate.

2. The method of claim 1, further comprising:
   terminating the application of the force, wherein the terminating is performed after the curing of the encapsulant.

3. The method of claim 1 further comprising:
   selecting an angle based on an amount of estimated curing warpage.

4. The method of claim 1 further comprising:
   measuring an amount of warpage without applying the force;
   selecting an angle based on the amount of measured warpage.

5. The method of claim 1 wherein the clamping comprises:
   supporting the package strip on a non-zero angled land of a package strip carrier assembly; and
   applying a clamping force to constrain the package strip between the land and a non-zero angled fin.

6. The method of claim 1 wherein the force is applied by at least one of rotating a screw, releasing a spring, and actuating a lever.

7. The method of claim 1, wherein prior to the clamping the edges of the substrate, the method further comprises:
   placing the package substrate into a carrier having non-zero angled lands which are at a non-zero angle as measured from a horizontal axis that is substantially parallel with a top or a bottom of the carrier.

8. The method of claim 7, wherein the engaging the major surface portion comprises engaging the major surface portion of package substrate near the edge of the package substrate between a non-zero angled fin and a corresponding non-zero angled land, wherein the corresponding non-zero angled fin is substantially parallel to the non-zero angled land.

9. A method for controlling warpage of a package strip during curing, the package strip including a plurality of integrated circuit dies encapsulated on a package substrate, the method comprising:
   placing the package strip into a package strip carrier assembly, the package strip carrier assembly having a plurality of non-zero angled lands which are disposed at a non-zero angle with respect to a horizontal axis that is substantially parallel to a first major surface of the package strip;
   clamping edges of the package strip between non-zero angled lands of the plurality of non-zero angled lands and corresponding non-zero angled fins that are substantially parallel to the non-zero angled lands to apply a force to the package substrate to cause an initial deformation to the package substrate to counter an expected cure-induced warpage of the encapsulant on the package substrate during curing of the encapsulant;
   curing the encapsulant; and
   releasing the edges of the cured package substrate.

10. The method of claim 9, wherein during the clamping, the non-zero angled lands of the plurality of non-zero angled lands engage the first major surface of the package substrate, and the non-zero angled fins engage a second major surface of the package substrate, opposite the first major surface.

11. The method of claim 9 further comprising:
    selecting a non-zero angle for the non-zero angled lands and corresponding non-zero angled fins based on an amount of estimated curing warpage.

12. The method of claim 9 further comprising:
    measuring an amount of warpage without applying the force;
    selecting a non-zero angle for the non-zero angled lands and corresponding non-zero angled fins based on the amount of measured warpage.

13. The method of claim 9, wherein the horizontal axis is also substantially paralled to a top or a bottom of the package strip carrier assembly.

* * * * *